(12) United States Patent  
Gautama

(10) Patent No.: US 9,171,538 B2  
(45) Date of Patent: Oct. 27, 2015

(54) METHOD AND SYSTEM FOR REDUCING IMPULSIVE NOISE DISTURBANCE

(71) Applicant: NXP B.V., Eindhoven (NL)

(72) Inventor: Temujin Gautama, Boutersem (BE)

(73) Assignee: NXP, B.V., Eindhoven (NL)

( * ) Notice: Subject to any disclaimer, the term of this patent is extended or adjusted under 35 U.S.C. 154(b) by 230 days.

(21) Appl. No.: 14/023,704

(22) Filed: Sep. 11, 2013

(65) Prior Publication Data

US 2014/0072132 A1 Mar. 13, 2014

(30) Foreign Application Priority Data

Sep. 13, 2012 (EP) ..................................... 12184317

(51) Int. Cl.

| | | |
|---|---|---|
| *G10K 11/178* | (2006.01) | |
| *H04B 1/10* | (2006.01) | |
| *G10L 21/0208* | (2013.01) | |
| *H03G 3/34* | (2006.01) | |
| *G10L 21/0224* | (2013.01) | |
| *G10L 21/0232* | (2013.01) | |

(52) U.S. Cl.
CPC .......... *G10K 11/178* (2013.01); *G10L 21/0208* (2013.01); *H03G 3/345* (2013.01); *H04B 1/1027* (2013.01); *G10L 21/0224* (2013.01); *G10L 21/0232* (2013.01)

(58) Field of Classification Search
CPC . G10K 11/175; G10K 11/178; G10K 11/346; G10K 2200/10; G10K 2210/115; H04R 1/1083; H04R 2227/001

USPC ................... 381/71.4, 71.14, 73.1, 94.1, 94.8
See application file for complete search history.

(56) References Cited

U.S. PATENT DOCUMENTS

| | | | |
|---|---|---|---|
| 6,385,261 B1 | 5/2002 | Tsuji et al. | |
| 6,654,471 B1 | 11/2003 | Varga | |
| 7,260,163 B2 | 8/2007 | Li et al. | |
| 8,081,757 B2 | 12/2011 | Voessing et al. | |
| 8,538,052 B2 * | 9/2013 | Elmedyb et al. ............. | 381/318 |
| 2003/0210749 A1 * | 11/2003 | Asjadi .......................... | 375/260 |
| 2011/0129036 A1 | 6/2011 | Okuhata | |

FOREIGN PATENT DOCUMENTS

| | | |
|---|---|---|
| CN | 1294124 A | 1/1999 |
| CN | 101263552 A | 9/2008 |
| CN | 101690267 A | 3/2010 |

OTHER PUBLICATIONS

Vaseghi, S. V. et al. "Detection and Suppression of Impulsive Noise in Speech Communication Systems", IEE Proceedings I Communications, Speech and Vision, vol. 137, No. 1, pp. 38-46 (Feb. 1990).

(Continued)

*Primary Examiner* — Paul S Kim  
*Assistant Examiner* — Sabrina Diaz

(57) ABSTRACT

FM and AM receivers in car environments require a noise blanker circuit or method to reduce the audible disturbances generated by impulse noise, such as ignition noise, in the audio signal. The invention proposes a combination of time-domain and frequency-domain processing to reduce the audible distortion. The time-domain processing interpolates the signal during the impulse noise bursts, and the frequency-domain processing disperses the remaining signal distortion over time, or relocates it to positions in time where it is attenuated by a windowing technique.

15 Claims, 4 Drawing Sheets

(56) References Cited

OTHER PUBLICATIONS

Extended European Search Report for Patent Appln. No. 12184317.1 (Feb. 6, 2013).

Office Action from Counterpart Application CN 201310408225.6 May 14, 2015).
Office Action from Counterpart Application CN 201310408225.6 (Feb. 2, 2015).

* cited by examiner

METHOD AND SYSTEM FOR REDUCING IMPULSIVE NOISE DISTURBANCE

CROSS-REFERENCE TO RELATED APPLICATIONS

This application claims the priority under 35 U.S.C. §119 of European patent application no. 12184317.1, filed on Sep. 13, 2012, the contents of which are incorporated by reference herein.

This invention relates to the reduction of impulsive noise disturbances, for example in radio receivers.

FM and AM receivers often have a noise blanker circuit or method to reduce the audible disturbances generated by impulse noise in the audio signal. This is a necessity in a car environment, where impulse noise, such as ignition noise, is picked up by the antenna of the car radio.

Ignition noise results in short broadband spikes in the audio signal, with a variable repetition rate, and the rate changes proportionally to the engine speed. There are many methods for detecting the presence of impulse noise, and these yield blanking pulses, which are high when the disturbance is present in the audio signal. An example is disclosed in U.S. Pat. No. 6,385,261.

These pulses can be of fixed or variable length and are an indication of which time segments are corrupted.

Prior art methods to reduce the interferences on the audio signal substitute these segments with a fixed value (these are so-called level-hold methods as also disclosed in U.S. Pat. No. 6,385,261), with a linear or higher-order interpolation using the sample values surrounding the corrupt segment (for example disclosed in US 2011/0129036), or with a prediction of the audio signal obtained using a signal model (for example disclosed in U.S. Pat. No. 7,260,163).

When the impulse noise has a certain, possibly variable, repetition rate, signal discontinuities that are present after application of the prior art methods, such as the level-hold system and signal interpolation, will also be repetitive, making them perceptually more annoying than single discontinuities. It would therefore be beneficial to lower the effect of these discontinuities.

The approach described in U.S. Pat. No. 7,260,163 uses an adaptive all-pole model to model the audio signal. Therefore, the approach will work well for (short duration) stationary signals that can be well predicted with a relatively low-order model (such as speech), but it is expected to perform worse on complex and non-stationary signals.

According to the invention, there is provided a system and method as defined in the independent claims.

In one aspect, the invention provides an audio processing system comprising:
a detector for detecting the presence of impulse noise;
processing means for processing an audio input signal in the time domain in dependence on a detected presence of impulse noise;
first means for transforming the input audio signal between the time domain and the frequency domain;
means for extracting the magnitude and phase spectra of the frequency domain signal;
means for modifying at least parts of the phase spectrum in dependence on a detected presence of impulse noise;
means for combining the magnitude spectrum and modified phase spectrum; and
second means for transforming the combined signal between the frequency domain and the time domain.

This invention thus provides a system and method for reducing impulsive noise, in particular for demodulated AM or FM audio signals. It uses signal processing in the time domain (for example signal interpolation), followed by a processing step in the frequency domain. This approach avoids the need for a prediction model, and can therefore be used for non-stationary signals with arbitrary complexity.

The means for modifying the phase spectrum can be adapted to set the phase to a constant value or to set the phase to a random value. The phase setting for different frequency components can be made in dependence on the magnitude of the corresponding frequency component. For this purpose, a frequency mask can be used for the phase modification based on the magnitude spectrum in the frequency domain.

Time windowing can be applied before the transformation to the frequency domain and after the transformation back to the time domain. This has the effect of suppressing edge effects (in the processing time window), and this is particularly useful for suppressing edge effects caused if the phase is set to a constant value.

In another aspect, the invention provides an audio processing method comprising:
detecting the presence of impulse noise;
processing an audio input signal in the time domain in dependence on a detected presence of impulse noise;
transforming the input audio signal between the time domain and the frequency domain;
extracting the magnitude and phase spectra of the frequency domain signal;
modifying at least parts of the phase spectrum in dependence on a detected presence of impulse noise;
combining the magnitude spectrum and modified phase spectrum; and
transforming the combined signal between the frequency domain and the time domain.

Examples of the invention will now be described in detail with reference to the accompanying drawings, in which.

The invention provides a combination of time-domain and frequency-domain processing to reduce the audible distortion resulting from impulse noise. The time-domain processing for example interpolates the signal during the impulse noise bursts, and the frequency-domain processing disperses the remaining signal distortion over time, or relocates it to positions in time where it is attenuated by a windowing technique.

Figure 1:
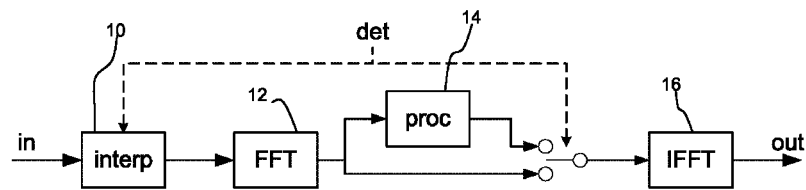
FIG. 1 shows a schematic diagram of the system of the invention.

FIG. 1 shows in schematic form an example of the system of the invention.

A detector signal ("det") is available that is high when the impulsive noise burst is present and is low when it is not. The type of detector that can be used is known, for example from the prior art identified above.

It can detect impulses based on high pass filtering, or using adaptive filtering to detect noise spikes. In essence, a deviation from the expected signal content is an indication of the presence of a spike. This can be signal energy in a version of the audio signal that is filtered in such a way that the audio content is attenuated and only the higher frequency region is retained (in this region, no audio content is expected, but only noise disturbances). This can also be the modelling error of an adaptive model that predicts the audio (a large modelling error indicates the presence of disturbances).

When the detector signal is high (impulse noise present), the input samples are labelled as invalid. Invalid samples are interpolated using the samples before and/or after a contiguous block of invalid samples. This interpolation is carried out by interpolation unit 10. This comprises time domain processing, and is dependent on the detection of impulse noise.

The samples are buffered for FFT processing using a weighted overlap-add technique, which is a standard technique described in the literature. The weighted overlap-add technique is an efficient way to implement FFT processing using a finite impulse response filter. In this technique a window is applied (prior to the final overlap-add to create the output signal). This "output window" is used in audio compression applications for minimizing processing artifacts. The output window fades out any artifacts at the frame boundaries, thereby suppressing audible discontinuities.

The FFT 12 is computed for a single frame, and it is further processed in processing unit 14 if there are invalid samples in the time frame. If there are no invalid samples, no frequency-domain processing is performed.

The result is transformed to the time domain by the inverse FFT unit 16, appropriately handled as is commonly done using the weighted overlap/add technique, yielding the output of the proposed method.

Figure 2:
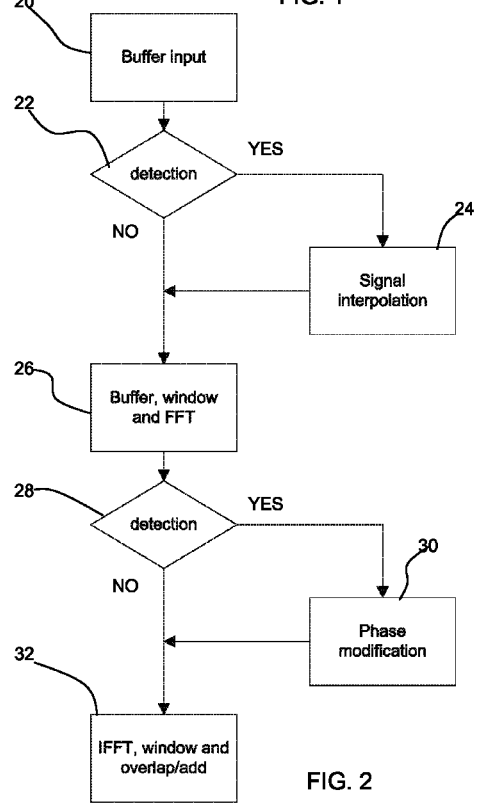
FIG. 2 shows a flow chart of the method of the invention.

FIG. 2 shows a corresponding flow chart of the proposed method.

The input is buffered in step 20. This buffering is also part of the system, although not shown in FIG. 1, The buffering introduces a deliberate delay so the time domain interpolation can be started sufficiently early, and also so that the frequency domain phase modification for a given FFT window can be processed when an impulse event is detected within that window. The detection signal thus enables the impulse event to be detected before the corresponding FFT window is processed.

The detection of impulse events is shown as step 22.

If there is an impulse event detected, time-domain processing is performed, shown as signal interpolation step 24 to replace the invalid samples, i.e., the samples for which the corresponding detector signal is high, with new sample values. These new sample values can be obtained using a variety of approaches, among which:

a level-hold method by which the invalid samples are replaced by the most recent valid sample value before the contiguous block of invalid samples;

signal interpolation by which the invalid samples are replaced by values obtained from a linear (or higher-order or other) interpolation of the valid sample values right before and right after the contiguous block of invalid samples;

signal processing by which the invalid samples are replaced by values obtained by processing of valid and invalid sample values.

These methods can all be considered generally to comprise signal interpolations in that the signal within a time window is replaced by values which are derived from a suitable signal analysis.

The time domain signal (which may or may not have been processed) is buffered and converted to the frequency domain by a FFT in step 26.

The same detection of impulse events is used again to control a phase modification. The detection is shown as step 28, and if there is an impulse event detected, a phase modification in the frequency domain takes place in step 30. The frequency domain signal (which may or may not have been processed) is converted back to the time domain by the IFFT in step 32.

Figure 3:
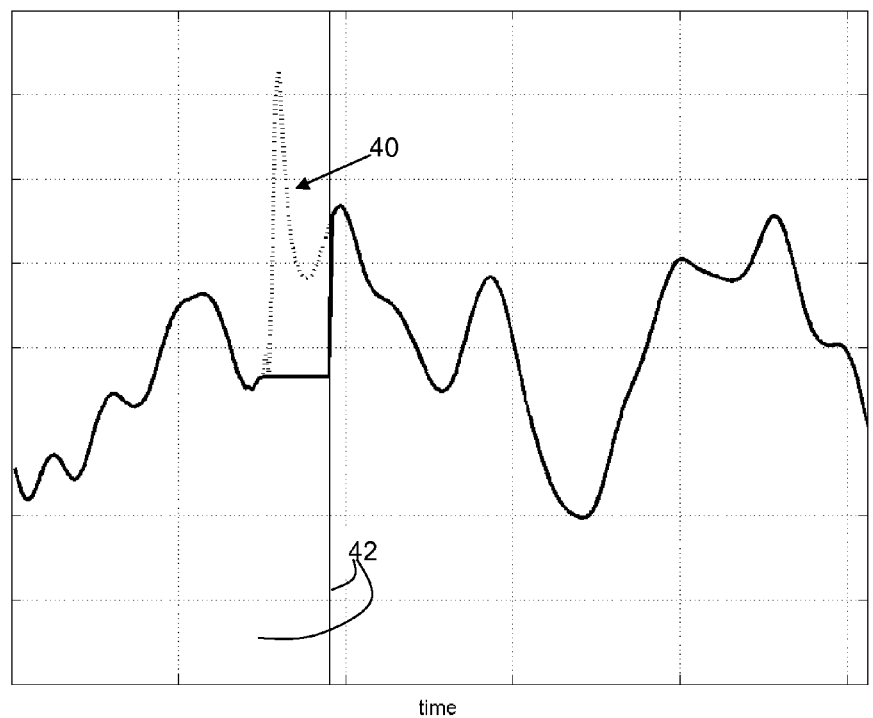
FIG. 3 shows a known signal interpolation using the level-hold approach which can be applied as the time domain processing in the system of FIG. 1.

An example of how the time domain processing can be implemented using a known level-hold method is shown in FIG. 3.

The input is represented by the dotted curve 40. The segment where the detector is high is demarcated by the two solid vertical lines 42. Within this region, the input sample values are invalid, and they are replaced using the level-hold technique, namely using the sample value right before the samples become invalid.

The output is represented by the solid curve which is identical to the dotted curve outside the demarcated region. It can be observed that the sharp peak, which is caused by the impulse noise, is effectively cancelled, but the output signal is clearly distorted in the region where it has been interpolated: it does not follow the characteristics of the signal. Furthermore, at the edges of this region, there are discontinuities in the derivative of the signal.

If this were a single occurrence, the distortion would be hardly noticeable, but when the impulse noise is repetitive in nature, this will be perceived as annoying.

The invention provides a method to disperse the signal distortion over the complete time window. It is based on the observation that a signal (distortion) peak can be dispersed over a time window by modifying its phase spectrum and retaining its magnitude spectrum.

The approach of the invention is explained with reference to FIG. 4.

The interference input signal is shown as a single burst, represented by the thin, solid curve 44. It is assumed that the time segment shown in the figure corresponds to a single frame to be processed by the spectral processing module (therefore, the length is equal to the size of the FFT). If this signal is transformed to the frequency domain (using an FFT), the phase spectrum is randomised, the magnitude spectrum is retained, and the complex-valued spectrum is transformed back to the time domain using an inverse FFT), the signal represented by the dashed curve 46 in FIG. 4 is obtained.

It can be observed that rather than a peak that is concentrated in time (the thin, solid curve 44), the energy of this peak is 'dispersed' over the complete time frame, yielding random noise with the same magnitude spectrum and energy as the input. The peak is formed by a certain alignment of the phases of the different frequencies, and is then destroyed by the phase randomisation.

Perceptually, the sharp peak is traded for coloured noise with a modest magnitude. It has the same energy as concentrated in the peak, but it is dispersed over the time window.

Figure 4:
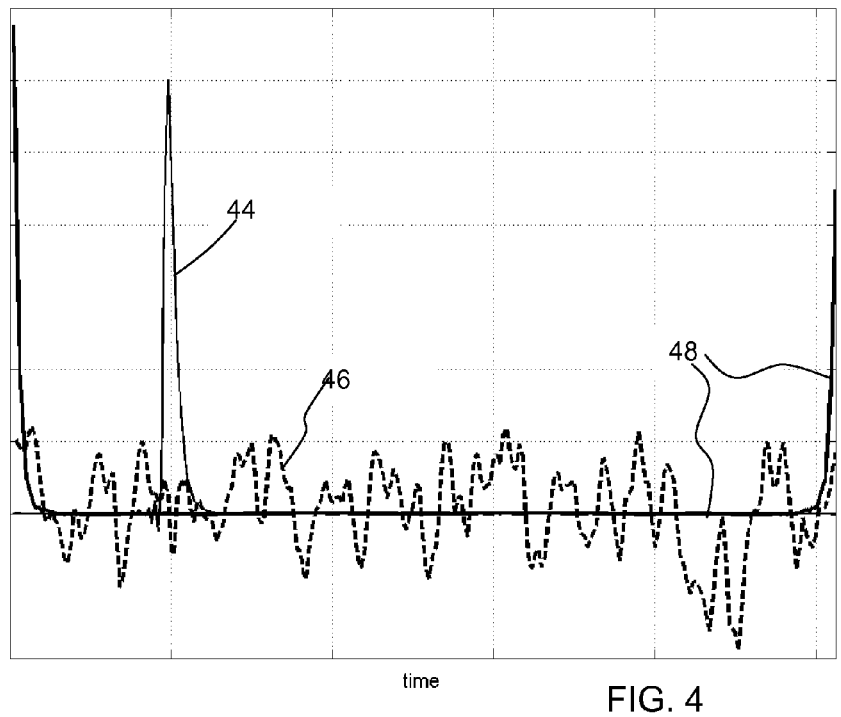
FIG. 4 shows an example of the effect of phase modification.

Rather than randomising the phase spectrum, all phases can be set to zero, leading to the signal represented by the thick, solid curve 48 in FIG. 4.

In this case, it can be observed that the peak is slightly altered in form (because the FFT assumes signal periodicity over the time window and the peak extends from the end of the frame to the beginning of the frame). More importantly, the energy of the peak is still concentrated in time, but its position is moved to the borders of the time window.

Because the energy is not dispersed over time as was the case for the phase randomisation, the signal characteristics, excluding the peak, are better retained.

Due to the weighted overlap-add technique which forms part of the FFT processing, the borders of the time window are suppressed. In particular, the time frame is multiplied with a time window, e.g. a square-root-Hanning window, that has very low or zero-values at the border. Therefore, by setting the phases to zero, the disturbance is first moved to the borders, after which it is suppressed by the square-root-Hanning (or other) window.

Figure 5:
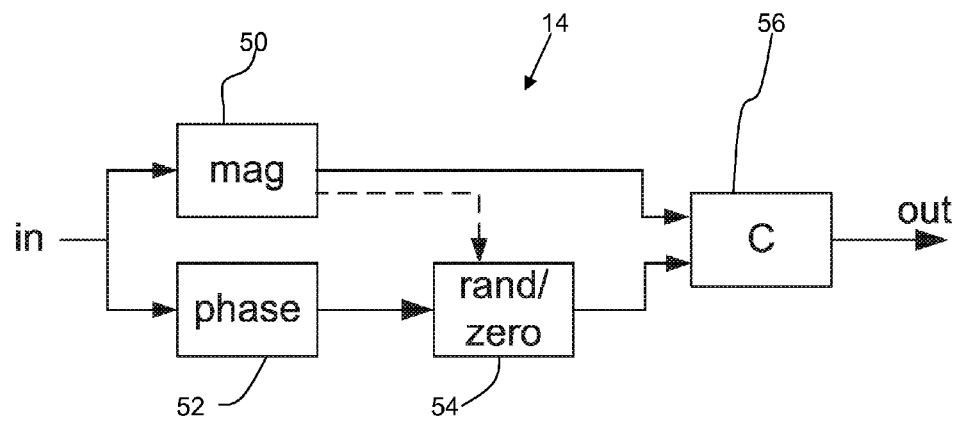
FIG. 5 shows an example of the frequency-domain processing module of the system of FIG. 1.

The frequency-domain processing module 14 in FIG. 1 is now explained in detail with reference to FIG. 5.

The input consists of the complex-valued frequency domain spectrum of the interpolated signal.

The magnitude ("mag") and phase spectrum ("phase") are computed in magnitude unit 50 and phase unit 52 and a frequency mask is determined based on the magnitude spectrum. The frequency mask is unity if the magnitude spectrum is below a certain threshold, and zero otherwise. Thus, frequency-domain processing uses a thresholding technique to determine per frequency bin whether the phase should be modified or not. The threshold can be a fixed value or it can be proportional to the instantaneous energy of the time window or to the expected signal energy.

The thresholding approach is based on the realisation that frequency bins with high magnitudes should remain untouched and frequency bins with low magnitudes should be modified. If the disturbance is an impulse (only a single non-zero value in the time window), the magnitude spectrum of the disturbance is identical for all frequency bins (the magnitude spectrum of an impulse is a flat line), so it will have less effect on the frequency bins with high magnitudes and more effect on the bins with low magnitudes. Therefore, only the phases with low corresponding magnitudes need to be modified.

The thresholding is optional, and instead the phase modification can take place whenever the impulse noise is detected.

The phase spectrum is modified in the frequency bins for which the frequency mask is unity. The phase spectrum modification either replaces the value by a random value or sets the phase for that frequency bin to zero, in unit 54.

The magnitude and phase spectra are combined into a complex-valued spectrum in combining unit 56, and the combination is the output of the processing module 14.

As explained above, if the phases are randomised, the distortion, or at least that part of the distortion where the signal magnitude is low, is dispersed over the time window. If the phases are set to zero, the distortion is concentrated at the border of the time window.

Figure 6:
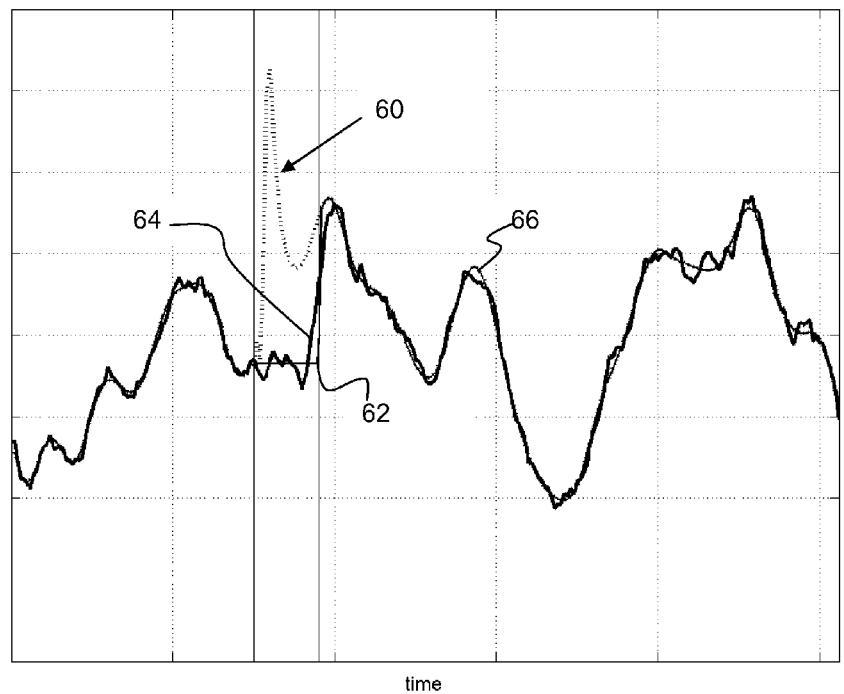
FIG. 6 shows an example of the effect of frequency-domain processing using phase randomisation.

An example of the frequency-domain processing is shown in FIG. 6 based on phase randomisation.

The original input signal (dotted curve 60) is processed in the time-domain using the level-hold technique, yielding the thin, solid curve 62 which is flat in the region where the impulse is detected, demarcated by the two vertical solid lines. After the randomisation of the phases for which the magnitude spectrum is below the average magnitude, the thick, solid curve 64 is obtained. It can be observed that it is a bit noisier (more 'jagged') than the interpolated signal outside the impulse window (the thin, solid curve 66) and that the segment within the interpolated region more closely follows the signal characteristics than the flat line of the interpolated signal.

The distortion of the interpolated signal is dispersed over the complete time window, making the signal a bit noisier across the complete time window.

Figure 7:
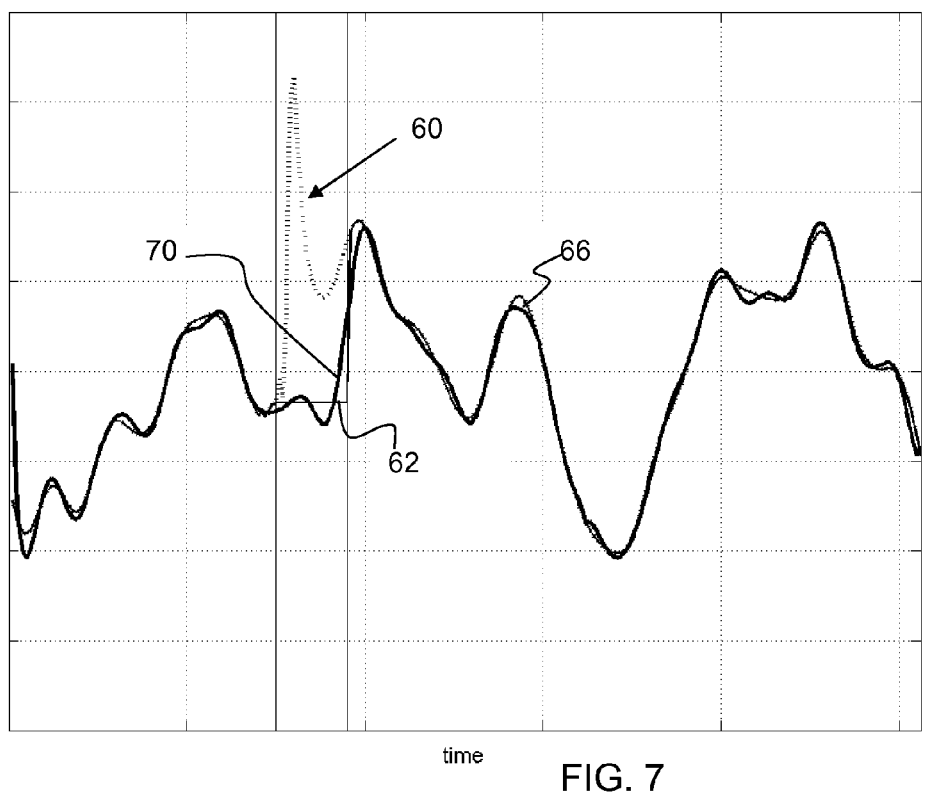
FIG. 7 shows an example of the effect of frequency-domain processing using phase zeroing.

An example of the frequency-domain processing is shown in FIG. 7 based on phase zeroing.

The same input signal 60 and interpolated signal 66 are used as in the previous example. Instead of phase randomisation, the phases for which the magnitude spectrum is below the average magnitude are set to zero, yielding the thick, solid curve 70. It can be observed that the signal does not become noisier than the interpolated signal and that the interpolated region is filled with samples that follow the signal characteristics.

The distortion, however, is concentrated in the beginning of the time frame, where the signal value is increased. This can be seen because the start values of the frame before and after processing do not match, as opposed to the previous example. This effect will be reduced by the windowing of the weighted overlap-add technique.

The method of the invention can be implemented as a software module that processes an FM or AM audio signal. The input signals can be mono or stereo. The preferred implementation of the module uses the following components:
a detector for the presence of impulse noise;
a frequency transform, including windowing before the transform and after the inverse transform;
a means for extracting the magnitude and the phase spectrum;
a means for generating a frequency mask based on the magnitude spectrum;
a means for modifying parts of the phase spectrum; and
a means for combining the magnitude and phase spectrum into a complex-valued spectrum.

The invention can be part of an FM or AM stereo tuner. It can be implemented as a software module to improve the audio signal quality in the presence of impulse noise, which is present in a car environment (e.g., ignition noise).

The FFT windowing processes can be based on the overlap-add technique or the windowed overlap-add technique. The first uses only a window before the time-to-frequency transform, and the other uses a window before the time-to-frequency and after the frequency-to-time transforms.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. An audio processing system comprising:
a detector for detecting the presence of impulse noise;
a processor, processing an audio input signal in the time domain in dependence on a detected presence of impulse noise;
a first device, transforming the audio input signal between the time domain and the frequency domain;
extractor, extracting the magnitude and phase spectra of the frequency domain signal;
modifier, modifying at least parts of the phase spectrum in dependence on the detected presence of impulse noise;
combiner, combining the magnitude spectrum and modified phase spectrum; and
second device, transforming the combined signal between the frequency domain and the time domain.

2. A system as claimed in claim 1, wherein the modifier modifying the phase spectrum is adapted to set the phase to a constant value.

3. A system as claimed in claim 1, wherein the modifier modifying the phase spectrum is adapted to set the phase to a random value.

4. A system as claimed in claim 2, wherein the modifier modifying the phase spectrum is adapted to set the phase for different frequency components in dependence on the magnitude at the corresponding frequency.

5. A system as claimed in claim 4, wherein the modifier modifying at least parts of the phase spectrum is adapted to generate a frequency mask which identifies the frequencies for which phase modification is to take place, based on the magnitude spectrum.

6. A system as claimed in claim 1, wherein the first device is adapted to apply time windowing before the transformation.

7. A system as claimed in claim 6, wherein the second device is adapted to apply time windowing after the transformation.

8. A system as claimed in claim 1, wherein the processor is adapted to apply a signal interpolation.

9. A radio tuner comprising a system as claimed in claim 1 for reducing impulse noise.

10. An audio processing method comprising:
    detecting the presence of impulse noise;
    processing an audio input signal in the time domain in dependence on a detected presence of impulse noise;
    transforming the audio input signal between the time domain and the frequency domain;
    extracting the magnitude and phase spectra of the frequency domain signal;
    modifying at least parts of the phase spectrum in dependence on the detected presence of impulse noise;
    combining the magnitude spectrum and modified phase spectrum; and
    transforming the combined signal between the frequency domain and the time domain.

11. A method as claimed in claim 10, wherein modifying the phase spectrum comprises:
    setting the phase to a constant value; or
    setting the phase to a random value.

12. A method as claimed in claim 11, wherein modifying the phase spectrum comprises setting the phase for different frequency components in dependence on the magnitude at the corresponding frequency.

13. A method as claimed in claim 12, wherein modifying at least parts of the phase spectrum comprises generating a frequency mask which identifies the frequencies for which phase modification is to take place, based on the magnitude spectrum.

14. A method as claimed in claim 10, wherein the transforming between the time domain and the frequency domain, and the between the frequency domain and the time domain comprise time windowing.

15. A non-transitory computer readable storage medium carrying executable program code which when run on a computer implements the method of claim 10.

* * * * *